(12) United States Patent
Trask

(10) Patent No.: US 12,562,583 B2
(45) Date of Patent: *Feb. 24, 2026

(54) FUZE CART SYSTEM AND METHOD FOR MOBILE DEVICE CHARGING STATION

(71) Applicant: Keone Trask, Greenville, SC (US)

(72) Inventor: Keone Trask, Greenville, SC (US)

(73) Assignee: Clear Touch Interactive, Inc., Greenville, SC (US)

( * ) Notice: Subject to any disclaimer, the term of this patent is extended or adjusted under 35 U.S.C. 154(b) by 114 days.

This patent is subject to a terminal disclaimer.

(21) Appl. No.: 18/351,152

(22) Filed: Jul. 12, 2023

(65) Prior Publication Data

US 2025/0023364 A1     Jan. 16, 2025

Related U.S. Application Data

(62) Division of application No. 17/480,912, filed on Sep. 21, 2021, now Pat. No. 12,401,211.

(Continued)

(51) Int. Cl.
H01M 10/46       (2006.01)
G06F 1/26        (2006.01)
(Continued)

(52) U.S. Cl.
CPC ............ H02J 7/0044 (2013.01); G06F 1/266 (2013.01); H02J 7/00034 (2020.01);
(Continued)

(58) Field of Classification Search
CPC .... H02J 7/0044; H02J 7/00034; H02J 7/0048; H02J 7/0047; H02J 7/0013; H05K 7/1417; H05K 7/20172
(Continued)

(56) References Cited

U.S. PATENT DOCUMENTS

| | | | |
|---|---|---|---|
| 7,392,068 B2 * | 6/2008 | Dayan | H01R 25/147 |
| | | | 439/246 |
| 10,965,778 B1 * | 3/2021 | Massover | H02J 7/0013 |
| 2009/0236140 A1 * | 9/2009 | Randall | H01R 13/2421 |
| | | | 174/268 |

FOREIGN PATENT DOCUMENTS

| | | | | |
|---|---|---|---|---|
| CN | 110061532 A | * | 7/2019 | |
| GB | 2477258 A | * | 7/2011 | H01R 13/03 |

* cited by examiner

*Primary Examiner* — Edward Tso
(74) *Attorney, Agent, or Firm* — John R. Perkins, Jr.; Perkins Law Firm

(57) ABSTRACT

The present invention generally relates to automatic charging systems and methods for mobile devices that require more power than is possible with inductive chargers. A mobile device charging cabinet is provided, wherein each mobile device inserted for charging contains a charging receiver that is attached to a cover, such as a laptop cover. The cabinet further comprises a multiplicity of base stations, each of which provides a grid of conductive alternating polarity connection plates, spaced to accept two prongs similarly spaced on the bottom of the charging receiver. Power flows from the base station automatically through the charging receiver to the mobile device when it is placed on a surface containing a base station within the cabinet. Computer software is included to control and monitor all functionality of the system, such as optimal power flow and battery charging; and further provides key asset management tools to allow a user to know, for example, the number and exact location of all devices using the invention and under his or her control.

34 Claims, 9 Drawing Sheets

Related U.S. Application Data

(60) Provisional application No. 63/088,720, filed on Oct. 7, 2020.

(51) Int. Cl.
| | |
|---|---|
| *H02J 7/00* | (2006.01) |
| *H05K 5/02* | (2006.01) |
| *H05K 7/14* | (2006.01) |
| *H05K 7/20* | (2006.01) |

(52) U.S. Cl.
CPC ........ *H02J 7/00045* (2020.01); *H02J 7/0013* (2013.01); *H02J 7/0029* (2013.01); *H02J 7/0047* (2013.01); *H02J 7/0048* (2020.01); *H05K 5/0213* (2013.01); *H05K 7/1417* (2013.01); *H05K 7/20172* (2013.01)

(58) Field of Classification Search
USPC ................ 320/107, 109, 114, 115, 116, 148
See application file for complete search history.

| V− | V+ | V− | V+ | V− | V+ | V− | V+ |
|---|---|---|---|---|---|---|---|
| V+ | V− | V+ | V− | V+ | V− | V+ | V− |
| V− | V+ | V− | V+ | V− | V+ | V− | V+ |
| V+ | V− | V+ | V− | V+ | V− | V+ | V− |

FUZE CART SYSTEM AND METHOD FOR MOBILE DEVICE CHARGING STATION

CROSS-REFERENCE TO RELATED APPLICATIONS

This application claims priority to U.S. Provisional Patent Application No. 63/088,720 filed Oct. 7, 2020; and U.S. patent application Ser. No. 17/480,912 filed Sep. 21, 2021, all of which are incorporated herein by reference.

The present invention generally relates to electrical charging systems and methods and, more particularly, to a system and method for charging multiple mobile devices simultaneously that require higher wattage throughput to quickly recharge or continuously operate.

BACKGROUND OF THE INVENTION

Educational institutions have recently begun providing mobile devices, such as laptop computers, to many of their students, especially K-12 students. Those devices are used throughout a typical day and then placed back into a cabinet or other storage means overnight. It is generally the responsibility of students to manually attach a charging cord to the laptop as it is returned to storage each night, but students often forget or fail to successfully connect the laptop to a charger, which is not discovered until the following day when the laptop is immediately needed. This method also uses a multiplicity of individual charging cables that fray and fail over time with use.

In such cases, the only options for the student at that point is to either (1) retrieve and connect a power cord and charger and run it all the way to the student's desk, where the cord is typically run from a nearby wall outlet, and the cord generally obstructs one or more walkways in the classroom for the next few hours, or (2) forego use of the laptop for a few hours. A system and method that automatically recharges the laptop overnight without the need for manually connecting a power cord would prevent these problems.

In addition, most classrooms now provide each individual student in the classroom with a mobile device simultaneously so that all of the devices must be recharged and available simultaneously. This presents an even greater problem where the classroom is faced with charging different devices of different charge states simultaneously. What is needed is a charging station that can accept a multiplicity of mobile devices, read the charge status of each device, and then implement a specific charging mode to recharge each device as quickly as safely possible.

The fact that nearly all students are now allocated an expensive mobile device is also a problem for administrators. The multiplicity of devices must be tracked and accounted for on a regular basis. Each device also requires periodic updates and maintenance. What is needed is a system and method that accounts for a multiplicity of mobile devices in a classroom, school, or other heavy user location. What is also needed is a system and method of automatically connecting to each of those devices and updating them. What is also needed is a system and method of monitoring the operational status of each device for tracking and maintenance purposes.

Most mobile devices are provided with a system that effectively recharges the device and allows continuous operation. Those systems require a continuous electrical connection, however, in order to do so. When direct electrical connection is required, a power cord and charger must be employed, along with the attendant issues described above.

Charging systems have attempted to address the need for charging without a direct electrical connection, but those systems are limited in power throughput because of the losses involved, as well as the limitations in voltages and currents that may be safely induced through inductive charging means. Smaller devices such as cellphones may be recharged with inductive systems but those devices use less power and nevertheless require full overnight inductive connection to fully charge. A system that fully charges a more power-intensive mobile device, such as a laptop, overnight without requiring a student, teacher, or other user to manually connect a factory charger would provide a better means to prevent the problems discussed above.

In addition, inductive charging systems involve far greater electrical losses than conductive charging. As green solutions are further in demand, the need for solutions such as that provided by the invention are in further demand.

U.S. Pat. No. 7,392,068 discloses a system and method for conductively charging mobile devices using a flat surface base station (support device) that contains a series of charging plates. The base station is plugged into a common wall outlet. A receiving device (adapter) is attached to the charging port of a mobile device to power the mobile device. When the receiving device is placed on the base station, two electrical prongs extending from the receiving device make contact with two of the charging plates housed within the base station. When this contact is made, current flows from the charging plates to the electrical prongs. The electrical prongs then transfer current in the receiver to an output jack that is typically made to connect to the mobile device to provide charging power. The above system operates well with many devices.

These systems provide conductive charging so long as the receiver is somehow attached to the mobile device in the correct location, and as long as the receiver is placed on the base station in the correct location. What is needed is an integrated system that better attaches the receiver to the mobile device in a manner that provides automatic connection of the mobile device for charging, wherein the attachment is an easy-to-install after-market accessory, such as a laptop cover. A system and method that allows a student to simply place a laptop with such a cover into a cabinet would be ideal, but the system should also be adaptable to allow a student to simply place his or her laptop on top of a table or other flat surface as needed in the event no charging cabinet is used. In this manner, continuous power operation can be accomplished along with charging.

What is further needed is a cabinet or other storage means that contains a base unit for each laptop stored so as to provide charging current to the receiver within the enclosure to charge the laptop when not in use. Such a cabinet would ideally be plugged into a common wall outlet and lockable so as to safely and securely store laptops when not in use.

Another object of the present invention is to provide an enclosure for use on a mobile device, wherein a receiver is provided within the enclosure. In this instance the enclosure is typically a laptop cover or the like. Once the enclosure is securely placed on the mobile device, sufficient power throughput may be provided to allow automatic charging of multiple mobile devices by simply placing the mobile devices on a series of base station.

Another object of the present invention is to provide software that can control and monitor the functionality of not only a single mobile device charger but also a multiplicity of such devices. In other words, asset management is key when customers such as educational institutions have to manage dozens if not thousands of laptops. The invention further provides software with the functionality of allowing such asset management by enclosing communication means within each charging system so as not only to monitor the performance of charging, etc. but also the location and status of each mobile device itself. In this manner, a teacher or I/T administrator for a school can know the location, status, and functionality of all mobile devices in a school, county, or even in a state or country.

SUMMARY OF THE INVENTION

The present invention accomplishes the foregoing objects by providing a mobile device enclosure, such as a laptop cover, that contains a receiver comprising two electrical prongs designed to connect to two charging plates housed within a base unit. When the enclosure housing the mobile device is placed on the base unit, the electrical prongs make contact with two of the charging plates in the base unit. In this manner, the base unit supplies power to the receiver and then to the mobile device.

The present invention further accomplishes the foregoing objects by providing a charging cabinet with a series of base units placed inside, whereupon a user may place a series of mobile devices for charging when not in use.

The present invention further accomplishes the foregoing objects by providing a base station that may be placed in any location by itself or along with a series of base stations, to provide continuous power or charging for any number of mobile devices through the receiver and the base unit.

The present invention provides a system for automatically charging mobile devices, comprising: a receiver attached to an enclosure for use with a mobile device, wherein said receiver comprises two electrical prongs that extend outwardly, and wherein said receiver attaches to the power input of said mobile device; a substantially flat base unit comprising a multiplicity of charging plates, wherein, when said receiver is placed in contact with said base unit, said two electrical prongs establish electrical contact with at least two of said multiplicity of charging plates, and wherein power then flows from said base unit to said mobile device.

The present invention further provides a system wherein said receiver is embedded within said enclosure, which is provided as an after-market accessory for the mobile device.

The present invention further provides a system wherein said base unit and said mobile device communicate to control power delivery to said mobile device.

The present invention further provides a system wherein said communication comprises verification that said mobile device may be powered or charged by said system.

The present invention further provides a system wherein said communication comprises monitoring the status of power flow to said mobile device.

The present invention further provides a system wherein the base unit is integrated within one of an airplane, train, automobile, motorcycle, desk, and table.

The present invention further provides a system wherein the mobile device is one of a smartphone, tablet, laptop computer, and handheld electronic device.

The present invention further provides a system wherein said enclosure includes one or more LED lights to provide a status indicator.

The present invention further provides a method of automatically charging a mobile device comprising the steps of: providing a receiver attached to an enclosure for use with a mobile device, wherein said receiver comprises two electrical prongs that extend outwardly, and wherein said receiver attaches to the power input of said mobile device; providing a substantially flat base unit comprising a multiplicity of charging plates; and placing said receiver in contact with said base unit, wherein said two electrical prongs establish electrical contact with at least two of said multiplicity of charging plates, and wherein power then flows from said base unit to said mobile device.

The present invention further provides a method of automatically charging a mobile device wherein said receiver is embedded within said enclosure, which enclosure is provided as an after-market accessory for the mobile device.

The present invention further provides a method of automatically charging a mobile device wherein said base unit and said mobile device communicate to control power delivery to said mobile device.

The present invention further provides a method of automatically charging a mobile device wherein said communication comprises verification that said mobile device may be powered or charged by said system.

The present invention further provides a method of automatically charging a mobile device wherein said communication comprises monitoring the status of power flow to said mobile device.

The present invention further provides a method of automatically charging a mobile device wherein the base unit is integrated within one of an airplane, train, automobile, motorcycle, desk, and table.

The present invention further provides a method of automatically charging a mobile device wherein the mobile device is one of a smartphone, laptop computer, and handheld electronic device.

The present invention further provides a method of automatically charging a mobile device wherein said enclosure includes one or more LED lights to provide a status indicator.

The present invention further provides a system for automatically charging a mobile device comprising: a receiver attached to an enclosure for use with a mobile device, wherein said receiver comprises two electrical prongs that extend outwardly, and wherein said receiver attaches to the power input of said mobile device; a cabinet comprising a base unit comprising one or more charging plates, wherein, when said receiver is placed in contact with said base unit, said two electrical prongs establish electrical contact with said one or more charging plates, and wherein power then flows from said base unit to said mobile device.

The present invention further provides a system for automatically charging a mobile device comprising: a receiver attached to an enclosure for use with a mobile device, wherein said receiver comprises two electrical prongs that extend outwardly, and wherein said receiver attaches to the power input of said mobile device, a substantially flat surface comprising a base unit comprising one or more charging plates, wherein, when said receiver is placed in contact with said base unit, said two electrical prongs establish electrical contact with said one or more charging plates, and wherein power then flows from said base unit to said mobile device.

The present invention further provides a system for automatically charging a mobile device comprising a non-transitory computer readable medium encoded with a computer program comprising instructions that when executed by one or more processors cause the one or more processors to perform operations comprising: providing status information of one of a multiplicity of automatically charging mobile devices, each one of said automatically charging mobile devices comprising: a receiver attached to an enclosure for use with a mobile device, wherein said receiver comprises two electrical prongs that extend outwardly, and wherein said receiver attaches to the power input of said mobile device; and a substantially flat base unit comprising a multiplicity of charging plates, wherein, when said receiver is placed in contact with said base unit, said two electrical prongs establish electrical contact with at least two of said multiplicity of charging plates, and wherein power then flows from said base unit to said mobile device.

The non-transitory computer readable medium may optionally provide said base unit further comprising a processor.

The non-transitory computer readable medium may optionally provide said receiver further comprising a processor.

The non-transitory computer readable medium may optionally provide said cabinet further comprising a processor.

The present invention further provides a conductive charging receiver comprising: a processor, a power cable, and two electrical prongs that extend outwardly, whereby said two electrical prongs are configured to contact a substantially flat surface capable of transmitting power through said two electrical prongs to said power cable.

The conductive charging receiver may be optionally provided wherein said processor is configured to monitor and control the receipt of electrical power through said two electrical prongs.

The conductive charging receiver may be optionally provided wherein said processor is configured to discontinue the receipt of power through said two electrical prongs when the presence of another power source is detected.

The present invention further provides a power connector designed for connection to a mobile device for the provision of power charging with said mobile device, comprising: a charging cover operably engaged with said mobile electronic device, wherein said charging cover contains a first connector for electrical connection to a power port on said mobile electronic device, and wherein said first connector comprises a male portion that is electrically engaged with said power port on said mobile electronic device internally within said charging cover, and wherein said first connector further comprises a female portion designed to accept a connector external to said charging cover for electrical connection to a power port on said mobile electronic device; a second connector for electrical connection to a power port on said mobile electronic device, wherein said second connector comprises a male portion that is capable of operably connecting to said female portion of said first connector and wherein said second connector further comprises a female portion that is capable of accepting a third connector for electrical connection to a power port on said mobile electronic device.

The power connector may be optionally provided wherein said electrical connection to a power port may also facilitate communications with said mobile electronic device.

The present invention further provides a communications connector designed for connection to a mobile device for the provision of electronic communication with said mobile device, comprising: a charging cover operably engaged with said mobile electronic device, wherein said charging cover contains a first connector for electrical connection to a communications port on said mobile electronic device, and wherein said first connector comprises a male portion that is electrically engaged with said communications port on said mobile electronic device internally within said charging cover, and wherein said first connector further comprises a female portion designed to accept a connector external to said charging cover for electrical connection to said communications port on said mobile electronic device; a second connector for electrical connection to said communications port on said mobile electronic device, wherein said second connector comprises a male portion that is capable of operably connecting to said female portion of said first connector and wherein said second connector further comprises a female portion that is capable of accepting a third connector for electrical connection to said communications port on said mobile electronic device.

The communications connector may be optionally provided wherein said electrical connection to a communication port may also facilitate power delivery to said mobile electronic device.

The present invention further provides a system for automatically charging a multiplicity of mobile devices, comprising: a power supply; a receiver attached to an enclosure for use with a mobile device, wherein said receiver comprises two electrical prongs that extend outwardly, and wherein said receiver attaches to the power input of said mobile device; a cabinet comprising a multiplicity of base units each comprising one or more charging plates, wherein, when said receiver is placed in contact with one of said base units, said two electrical prongs establish electrical contact with said one or more charging plates, and wherein power then flows from said base unit to said mobile device; a processor operably connected to said power supply, said receiver and said multiplicity of said base units, wherein the processor is configured to electrically communicate with said power supply, said receiver, and said multiplicity of said base units to detect one or more parameters representing the status of said mobile device.

The system may be optionally provided wherein said processor is further configured to respond to receipt of a parameter indicating that said mobile device needs to be charged, by directing said power supply to deliver electrical power to said mobile device.

The system may be optionally provided wherein said processor is further configured to respond to receipt of a parameter indicating that said mobile device needs to be charged, by directing said power supply to deliver electrical power to said mobile device in an optimal pattern so as to safely charge the battery within said mobile device.

The system may be optionally provided wherein said processor is further configured to respond to receipt of a parameter indicating that said mobile device needs to be charged, by directing said power supply to deliver electrical power to said mobile device in an optimal pattern so as to safely charge the battery within said mobile device so as to prolong the life of said battery.

The system may be optionally provided wherein said processor is further configured to respond to receipt of a parameter indicating that more than one said mobile device needs to be charged, by directing said power supply to deliver electrical power to each of the more than one said mobile device.

The system may be optionally provided wherein said processor is further configured to respond to receipt of a parameter indicating that more than one said mobile device needs to be charged, and that the charge state of each said mobile device requires delivery of power for charging at a different rate, by directing said power supply to deliver electrical power to each of the more than one said mobile device at a different rate that is optimal for individual charging for each said mobile device.

The system may be optionally provided wherein said processor is further configured to respond to receipt of a parameter indicating that more than one said mobile device needs to be charged, by directing said power supply to limit its delivery of electrical power to each of the more than one said mobile device so as not to overload the receptacle providing power to said system.

The system may be optionally provided wherein said processor is further configured to respond to receipt of a parameter indicating that said mobile device needs to be updated, by electronically delivering one or more updates to said mobile device.

The system may be optionally provided wherein said processor is further configured to respond to receipt of a parameter indicating that said mobile device is properly placed within said cabinet, by illuminating an indicator light.

The system may be optionally provided wherein said processor is further configured to respond to receipt of a parameter indicating that said mobile device is not properly placed within said cabinet, by illuminating an indicator light.

The system may be optionally provided wherein said processor is further configured to respond to receipt of a parameter indicating that said mobile device is not properly placed within said cabinet, by electronically delivering an alert message to one or more users.

The system may be optionally provided further comprising one or more vents in said cabinet so as to facilitate the circulation of air within said cabinet.

The system may be optionally provided further comprising one or more fans in said cabinet so as to facilitate the circulation of air within said cabinet.

The system may be optionally provided wherein each of said multiplicity of base units are set at an angle so as to facilitate proper placement of one or more mobile devices within said cabinet.

The present invention further provides a non-transitory computer readable medium encoded with a computer program comprising instructions that when executed by one or more processors cause the one or more processors to perform operations comprising: receiving status information of one or more of a multiplicity of connected mobile devices situated within a cabinet, each one of said connected mobile devices comprising: a receiver attached to an enclosure for use with each of said connected mobile device, wherein said receiver comprises two electrical prongs that extend outwardly, and wherein said receiver attaches to the power input of said mobile device, and wherein said cabinet comprises a multiplicity of base units, each of said base units comprising a substantially flat surface comprising a multiplicity of charging plates, and wherein, when said receiver is placed in contact with said base unit, said two electrical prongs establish electrical contact with at least two of said multiplicity of charging plates, and wherein power then flows from said base unit to said mobile device, and in response to said receiving status information of one of said multiplicity of connected mobile devices, performing a function that is needed by said one of said multiplicity of connected mobile devices.

The non-transitory computer readable medium may further comprise instructions wherein said performing a function that is needed by said one of said multiplicity of connected mobile devices comprises charging the battery of said one of said multiplicity of connected mobile devices.

The non-transitory computer readable medium may further comprise instructions wherein said performing a function that is needed by said one of said multiplicity of connected mobile devices comprises updating the software operating on said one of said multiplicity of connected mobile devices.

The non-transitory computer readable medium may further comprise instructions wherein said performing a function that is needed by said one of said multiplicity of connected mobile devices comprises notifying a user of said function that is needed by said one of said multiplicity of connected mobile devices.

The non-transitory computer readable medium may further comprise instructions wherein said performing a function that is needed by said one of said multiplicity of connected mobile devices comprises populating a database with said status information of one or more of a multiplicity of connected mobile devices.

DESCRIPTION OF THE DRAWINGS

The invention will be more readily understood with reference to the following specification in conjunction with the drawings herein.

DESCRIPTION OF THE PREFERRED EMBODIMENTS

Figure 1:
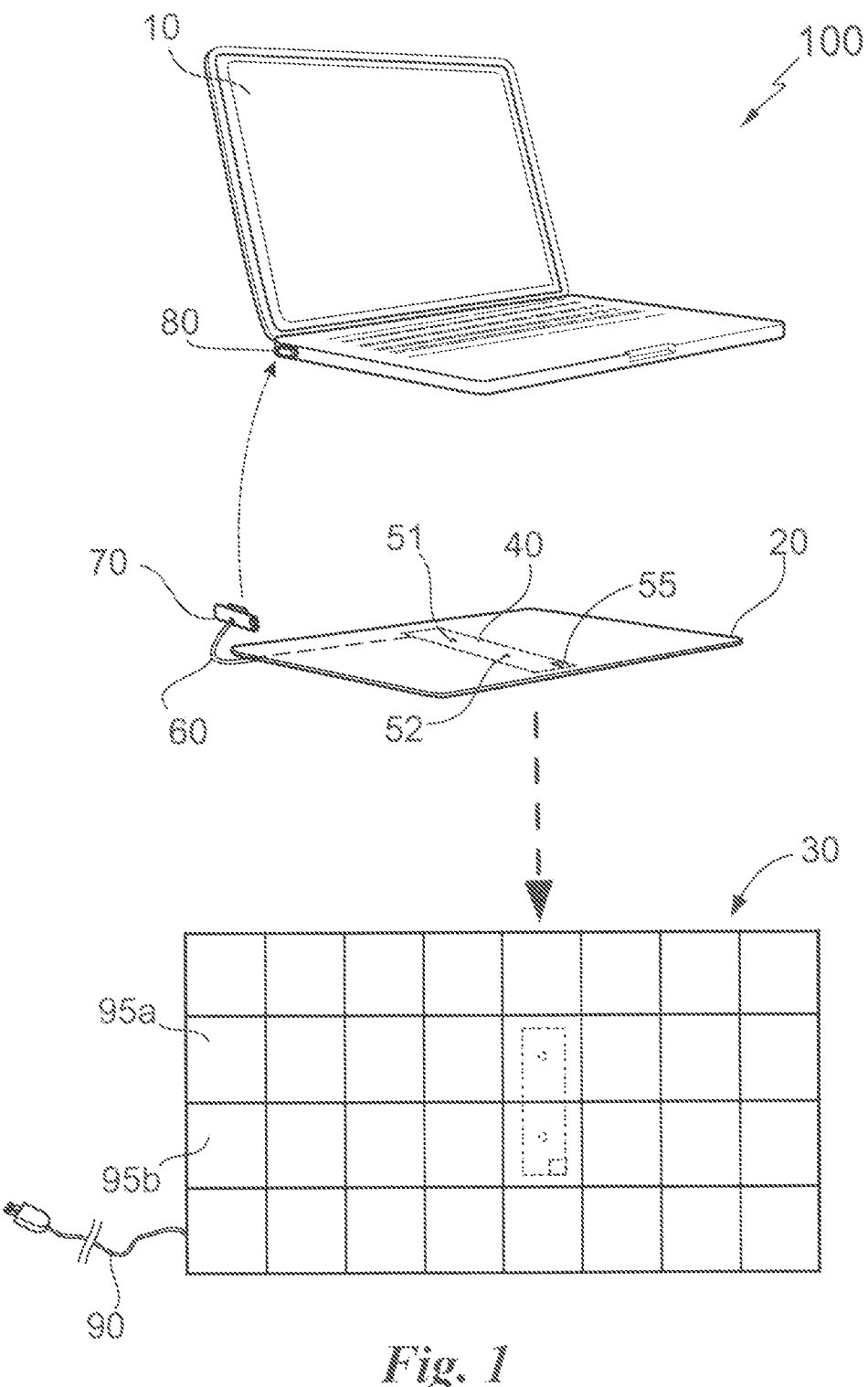
FIG. 1 is a perspective view of a system for automatically charging a mobile device according to a preferred embodiment of the invention.

Referring now to FIG. 1, a perspective view of a system 100 for automatically charging a mobile device according to a preferred embodiment of the invention is illustrated. Laptop 10 is placed within enclosure 20 and then placed on base station 30. Enclosure 20 includes receiver 40 comprising electrical prongs (contacts) 51 and 52. Receiver 40 further includes charging cable 60, which extends outside enclosure 20 and terminates in charger plug 70. Laptop 10 includes a charging port 80. Charger plug 70 is configured to connect to charging port 80.

Enclosure 20 is sized to accept and securely fasten to laptop 10. Once laptop 10 is securely attached to enclosure 20, charger plug 70 is connected to charging port 10 to supply power.

Base station 30 is plugged into an electrical outlet, preferably a standard electrical outlet as would be found in a classroom in whatever country the device is used. Once connected to power, each of the charging plates in base station 30, such as 95a and 95b, are designed to detect a connection by an electrical prong 51 or 52. This is accomplished when a user places laptop 10 and enclosure 20 onto base station 30, and electrical prongs 51 and 52 each come into electrical contact with one of the multiplicity of charging plates, such as 95a or 95b. When contact is established, the respective charging plates are energized to provide power to receiver 40 through electrical prongs 51 and 52. That power then flows through cable 60, plug 70 and port 80 into laptop 10. In this manner, laptop 10 is automatically charged by simply placing it onto base station 30.

Figures 2, 3:
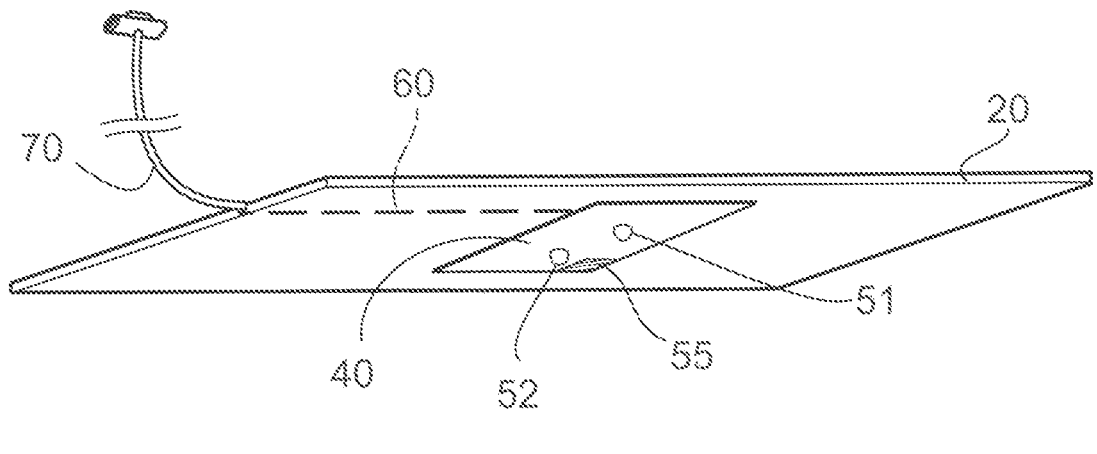
FIG. 2 is a perspective view of a receiver for use in automatically charging a mobile device according to a preferred embodiment of the invention.
FIG. 3 is a perspective view of a base unit for use in automatically charging a mobile device according to a preferred embodiment of the invention.

Referring now to FIG. 2, enclosure 20 is further illustrated according to a preferred embodiment of the invention. Enclosure 20 can be any size or shape as it is preferably sized to accept and securely fasten to any number of mobile devices. In a preferred embodiment, enclosure 20 is made of hard plastic and sized to accept a standard laptop computer. Receiver 40 is securely fastened to enclosure 20. In another embodiment, receiver 40 is formed within an injection molded place shell as enclosure 20. Power cable 60 extends to the outside of enclosure 20 to provide a path for power flow to the mobile device. Charging plug 70 is configured to connect to the charging port 80 (see FIG. 1) of the mobile device.

Processor 55 is optionally included to provide additional functionality as needed. In one embodiment, processor 55 contains computer software to communicate device location and status to display device 10, base station 30, or an external device.

The size and type of enclosure 20 and charging plug 70 must be coordinated so as to allow use with a specific mobile device. In another embodiment, charging plug 70 is a universal type of plug that allows for fitment to multiple types of mobile devices. In yet another embodiment, charging plug 70 accepts multiple adapters so as to provide power to many different types of mobile devices.

Receiver 40 further comprises electrical prongs (contacts) 51 and 52. These prongs are designed to extend slightly from the bottom of enclosure 20 so as to make electrical contact with base station 30 (see FIG. 1). The spacing of prongs 51 and 52 is preferably designed to provide a distance of exactly one charging plate, such as 95a and 95b in FIG. 1, so that contact is only possible between a single prong, 51 or 52, and a single electrical plate, 95a or 95b, at any given time.

Referring now to FIG. 3, a base station 30 is illustrated according to a preferred embodiment of the invention. Base station 30 comprises a multiplicity of charging plates, such as 95a, 95b, 95c, and 95d, each of which is constructed using a conductive material. The grid of charging plates provides a series of horizontal and vertical conductive plates, each separated by an insulating material. The system provides alternating opposite polarity for each contiguous charging plate. In one embodiment, direct current is distributed, whereby positive polarity is provided to V+ plates and negative polarity is provided to V− plates. In a preferred embodiment, alternating current is distributed, whereby the hot wire is provided to V+ plates and common wire is provided to V− plates. In either embodiment, power flows from any V+ plate to/from any V− plate.

In a preferred embodiment, base station 30 connects the hot wire from plug 90 to all V+ plates and the common wire from plug 90 to all V− plates. A processor 97 is preferably employed to provide a safer means of detecting the presence of a receiver prong 51 or 52. In this manner, no power is provided to any plate until a receiver prong 51 or 52 comes into contact with that plate. When receiver prong 51 and 52 come into contact with any two charging plates on the grid, processor 97 detects that condition and then energizes the respective charging plates to provide power to prongs 51 and 52.

Figure 4A:
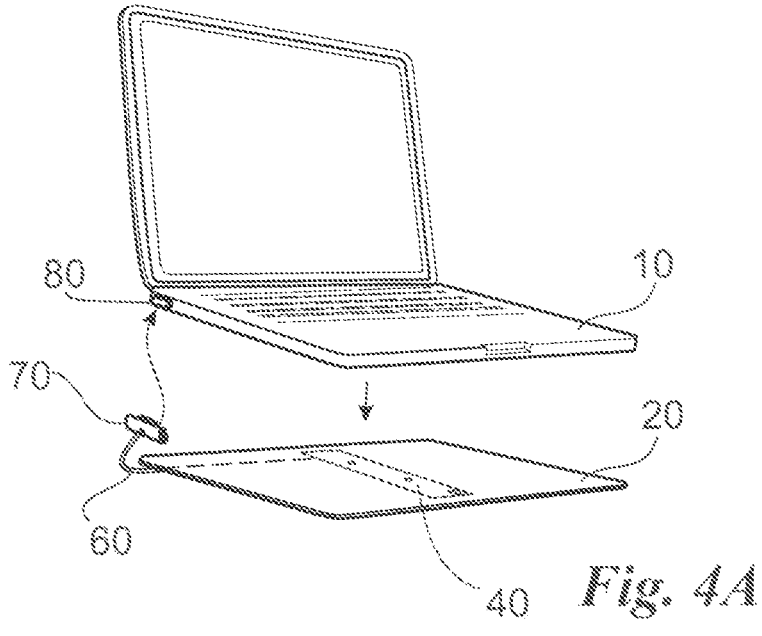
FIG. 4 is a perspective view of a mobile device and a receiver attached to an enclosure for automatically charging a mobile device according to a preferred embodiment of the invention.
Figure 4B:
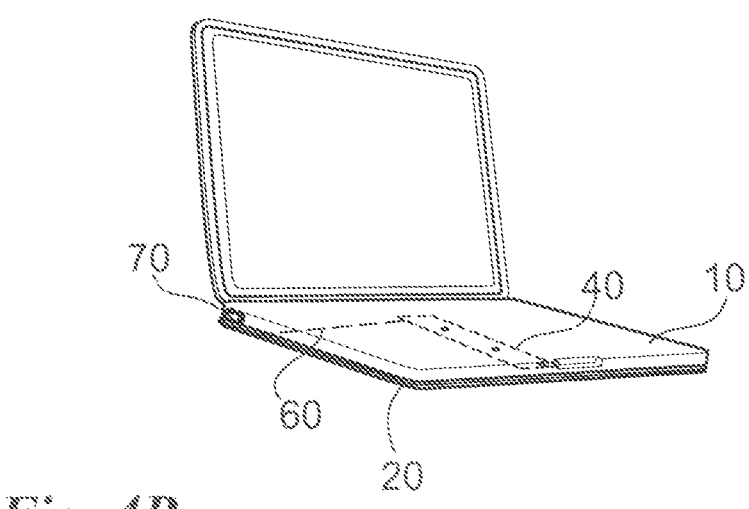

FIGS. 4A and 4B illustrate the connection of mobile device 10 to enclosure 20. When properly sized, enclosure 20 simply snaps onto the exterior of mobile device 10 and is thereby held securely in place. Also, when properly sized, charger plug 70 fits into charger port 80 on the mobile device to provide power from receiver 40. Charger plug 70 is preferably molded into the interior of enclosure 20 so that only a female portion of charger 70 is visible on the exterior of enclosure 20 when properly fitted.

Figure 5:
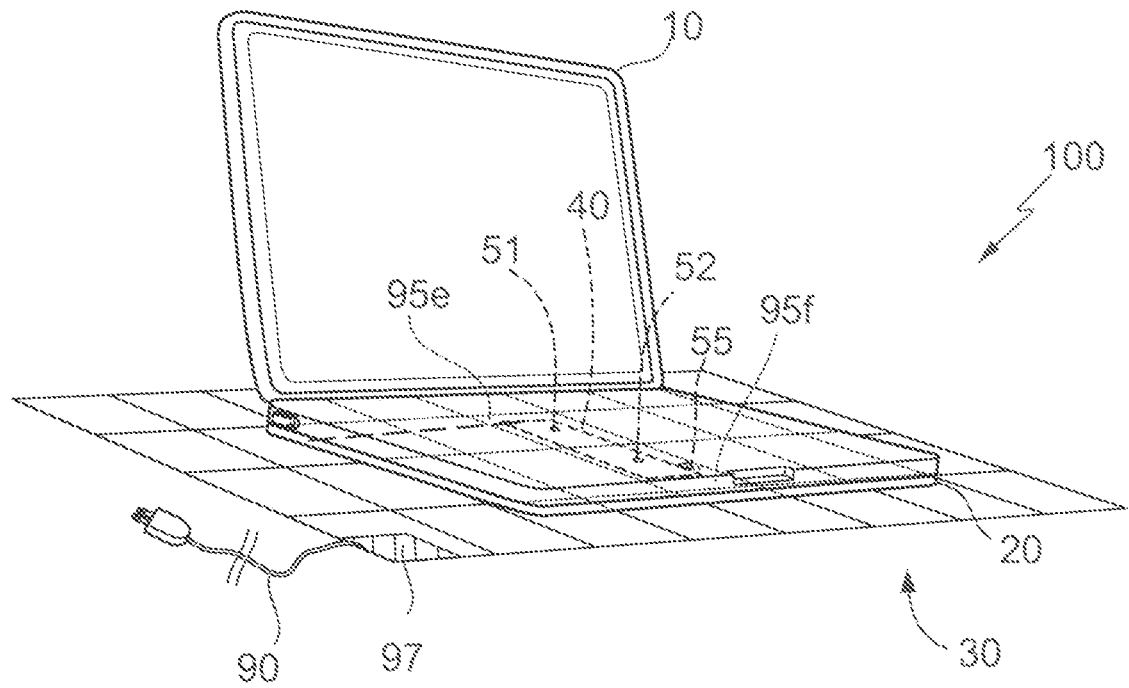
FIG. 5 is a perspective view of a system for automatically charging a mobile device according to a preferred embodiment of the invention.

FIG. 5 illustrates connection of the entire system 100 when all components are attached and connected. Base station 30 is plugged into an available wall outlet using plug 90. Enclosure 20 is securely fastened to laptop 10, which is placed onto base station 30. In this illustration, receiver prongs 51 and 52 make electrical contact with charging plates 95e and 95f, respectively. In this manner, receiver 40 automatically transmits power to laptop 10.

Alternatively, processor 97 detects the presence of receiver prongs 51 and 52 on charging plates 95e and 95f, respectively, and then energizes charging plates 95e and 95f to provide power to laptop 10.

Figure 6:
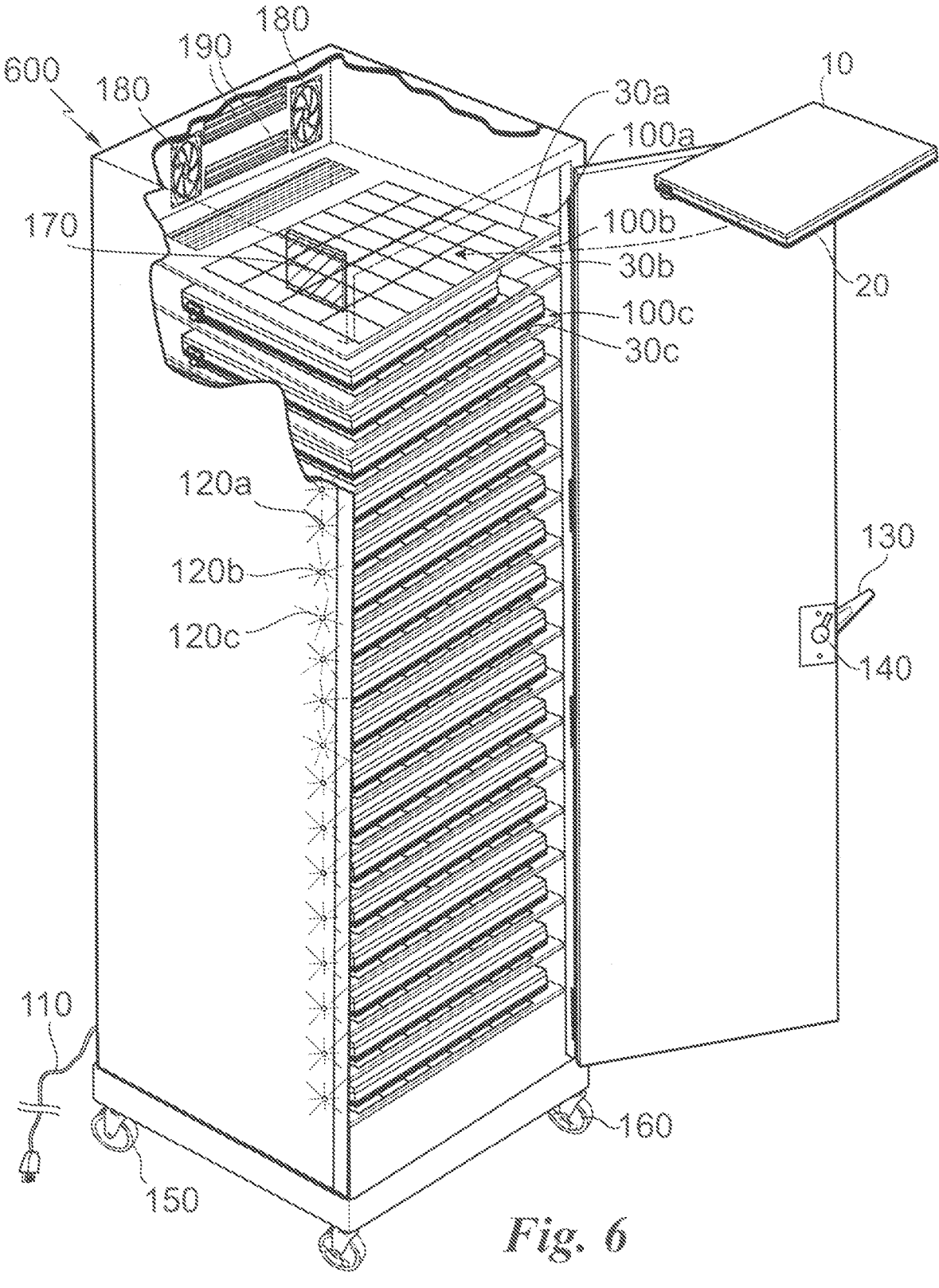
FIG. 6 is an illustration of a charging cabinet containing a multiplicity of base stations for use in automatically charging a multiplicity of mobile devices according to a preferred embodiment of the invention.

In yet another embodiment of the invention, FIG. 6 illustrates a charging cabinet 600 for use in automatically charging a multiplicity of mobile devices according to a preferred embodiment of the invention. Enclosure 20 is attached to a mobile device 10, in this case a laptop, and then placed into one of the available slots 100a inside cabinet 600. Available slot 100a has a base station 30a installed on a substantially flat surface, such as a shelf. Each base station, such as 30a, 30b, and 30c, for example, is provided with electrical power from power cord 110, which is preferably plugged into a standard wall outlet. Indicator lights 120a, 120b, and 120c provide a status indicator to indicate the status of available slots 100a, 100b, and 100c, respectively. These lights are configurable to show the status of each available slot and the mobile device contained therein such as open, charging, charged, updating, or malfunction. Optional door handle 130 may include a lock 140 to secure the cabinet. Optional wheels 150 may also be installed to easily move the cabinet about a room. Optional wheel locks 160 may be used to more securely hold the cabinet in place.

Fans 180 and vents 190 provide thermal management within the cabinet. Vents 190 are optimally located at the top of cabinet 600, to take advantage of rising heat created when the system is in operation. If the heat inside cabinet 600 is too great for natural circulation to remove, fans 180 may be used with standard temperature switches to remove hot air inside cabinet 600.

FIG. 6 further illustrates the need for an additional aspect of the invention—asset management. The invention is optionally provided with a processor 170 containing software to monitor and control the mobile devices (assets) within a system.

For example, a teacher or administrator may want to know how many laptops are stored in cabinet 600 overnight and whether they are fully charged. The invention, therefore, provides a system for automatically charging a mobile device comprising a non-transitory computer readable medium encoded with a computer program comprising instructions that when executed by one or more processors cause the one or more processors to perform operations comprising: providing status information of one of a multiplicity of automatically charging mobile devices, each one of said automatically charging mobile devices comprising: a receiver attached to an enclosure for use with a mobile device, wherein said receiver comprises two electrical prongs that extend outwardly, and wherein said receiver attaches to the power input of said mobile device; and a substantially flat base unit comprising a multiplicity of charging plates, wherein, when said receiver is placed in contact with said base unit, said two electrical prongs establish electrical contact with at least two of said multiplicity of charging plates, and wherein power then flows from said base unit to said mobile device.

More specifically, the software can easily be used to provide monitoring of each mobile device being charged with the invention. In this manner, a teacher, school administrator, or I/T administrator knows not only what devices are charged and ready for use, he or she also knows the exact location of all devices under his or her responsibility. In addition, the system allows for monitoring and control of all functions of the system and status of the mobile device. For example, the software can be used to monitor battery status, charging status, the number of touches a mobile device has, how well that device is performing, etc. Such information is critical to asset management and further provides an administrator vital information that can be used in managing assets under his or her control.

The above software can be easily incorporated into one or more processors included in the base station 30, receiver 40, or into cabinet 600.

Figure 7:
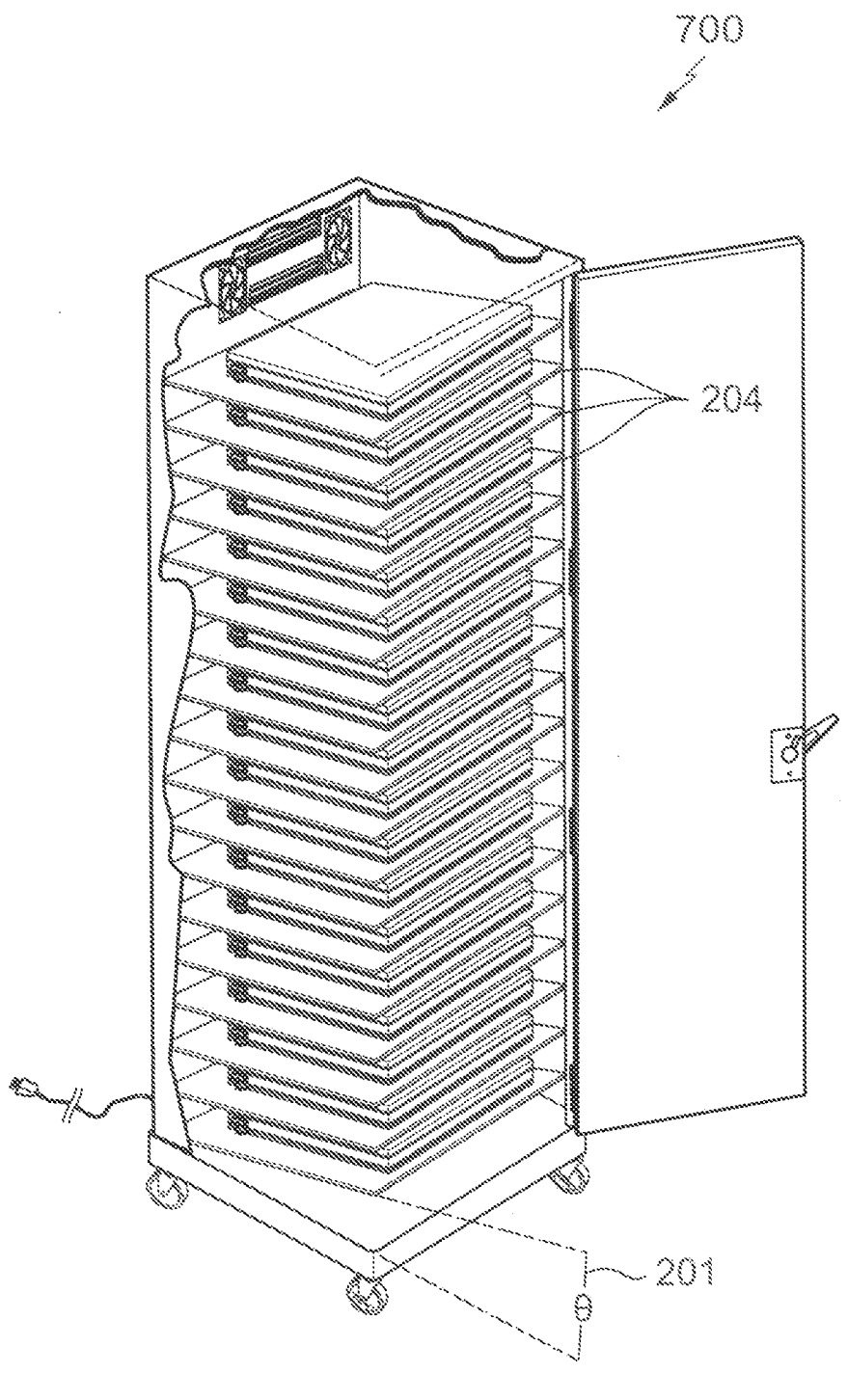
FIG. 7 is an illustration of a charging cabinet containing a multiplicity of base stations for use in automatically charging a multiplicity of mobile devices according to a preferred embodiment of the invention.

Referring now to FIG. 7, a charging cabinet 700 is illustrated according to a preferred embodiment of the invention. In this embodiment, a multiplicity of charging slots 204 are illustrated within charging cabinet 700. As a student or other user places his or her mobile device inside the cabinet it is desirable to have an angle on each of charging slots 204 so as to use gravity to slide the mobile device into the correct charging position within each charging slot 204. An angle 201 of approximately 15 to 45 degrees preferably allows proper insertion and extraction of the mobile devices, whereby each device easily slides into position along the surface of charging slot 204 when inserted until it contacts the back of the charging slot. Too small an angle would not cause the mobile device to slide into position with gravity. Too great an angle would cause the mobile device to slide into position too fast with gravity and possibly damage the device.

Figure 8:
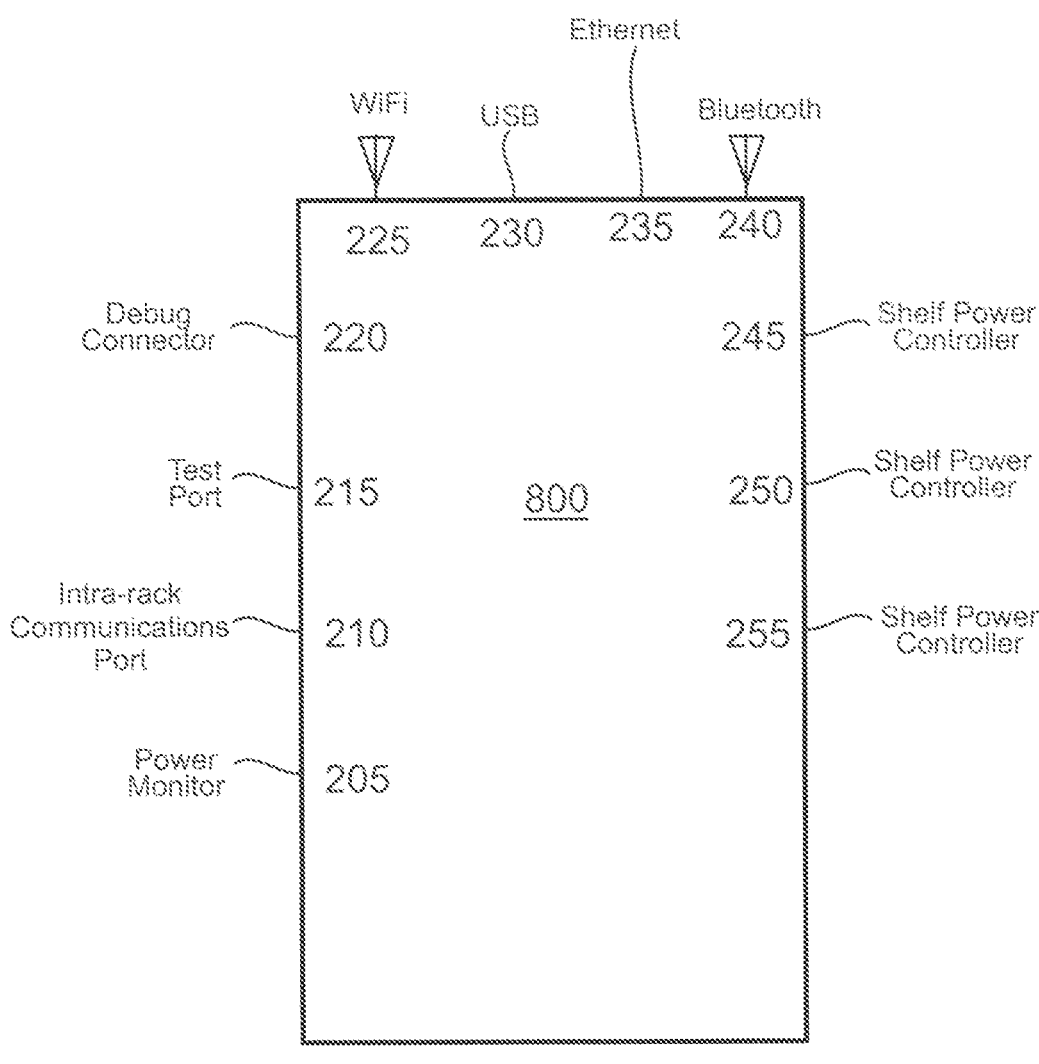
FIG. 8 is an illustration of a master controller used to control a mobile device charging cabinet according to a preferred embodiment of the invention.

Referring now to FIG. 8, the processor 170 of FIG. 6 is illustrated in more detail. Processor 170 may be implemented by a master controller 800, comprising software operating on a variety of internal microprocessors and electronic controllers that analyze and control an entire mobile device charging station. In a preferred embodiment, master controller 800 may connect to external sources for updates, control, and the like through one or more ports, such as power monitor port 205, intra-rack communications port 210, test port 215, debug connector 220, WiFi port 225, USB port 230, ethernet port 235, Bluetooth port 240, and shelf power controllers 245, 250, and 255. Each of these ports is bi-directional and, while most ports are hard-wired, some ports may be wireless, such as WiFi port 225 and Bluetooth port 240.

Figure 9:
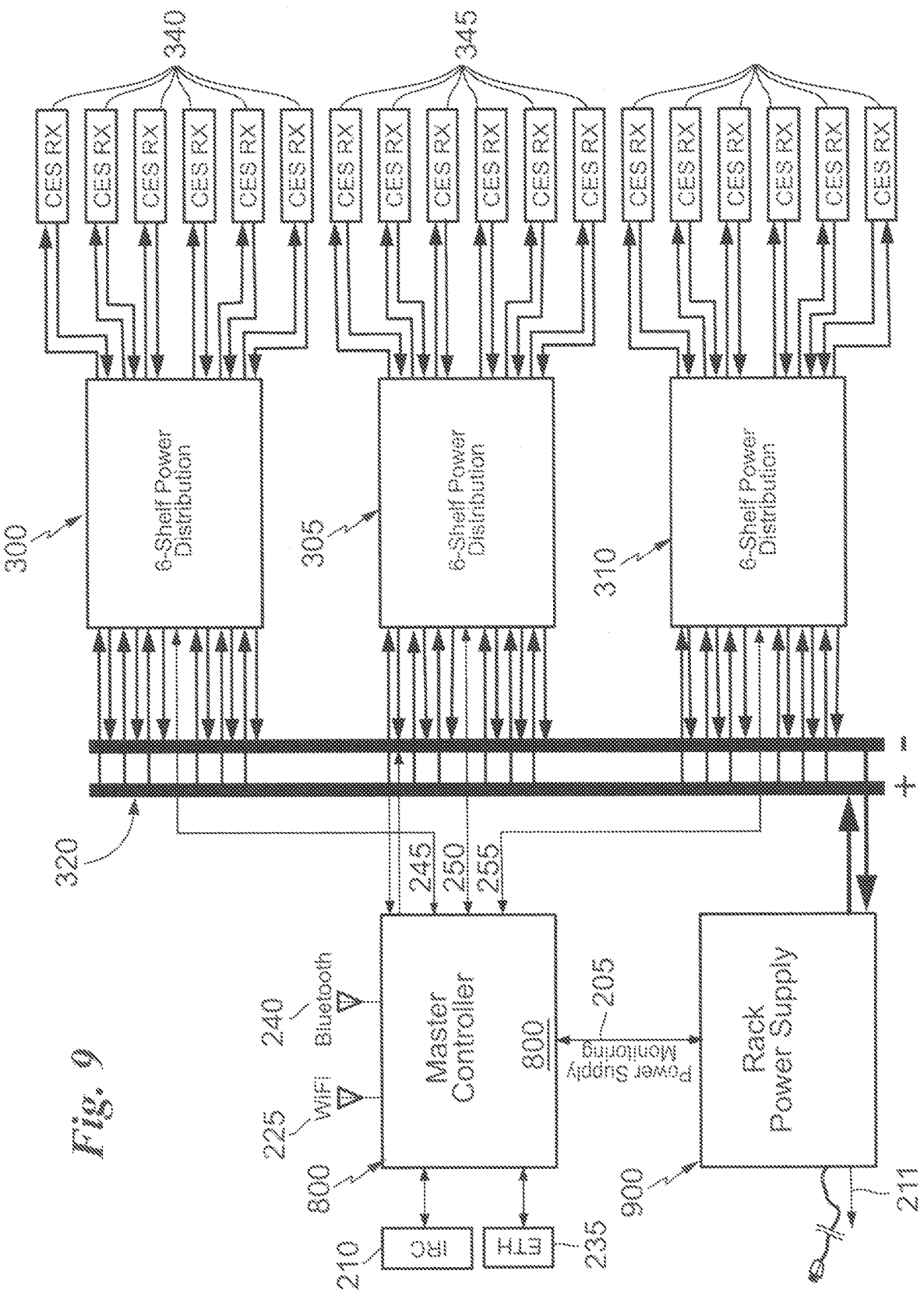
FIG. 9 is a line diagram of the electrical connections between the various components of a mobile device charging cabinet according to a preferred embodiment of the invention.

Referring now to FIG. 9, a line diagram of a preferred embodiment of the invention is illustrated to show the connections between master controller 800 and the remainder of the system. Master controller 800 connects directly to power supply 900 through port 205. Shelf power controller connections 245, 250, and 255 connect to three 6-shelf power distribution controllers 300, 305, and 310, respectively. In this manner, master controller 800 monitors and controls the power transmitted from a standard wall receptacle through power supply 900 to each of the 6-shelf power distribution controllers.

Main power bus 320 contains a positive leg and negative leg. Each of the 6-shelf power distribution controllers 300, 305, and 310 transmits power from main bus 320 to a bank of three groups of six individual charging slots 340, 345, and 350 per distribution controller to provide charging power to each of the base stations contained in each of the charging slots.

In a preferred embodiment, master controller 800 monitors and controls a wide variety of inputs and actions using embedded software. One of the primary control routines contained in the software monitors and controls power delivery to each of the base stations contained in each of the charging slots. Each base station, such as base station 30 illustrated in FIG. 3, is provided power to charge the mobile device through the receiver contained within or connected to the mobile device.

Figure 10:
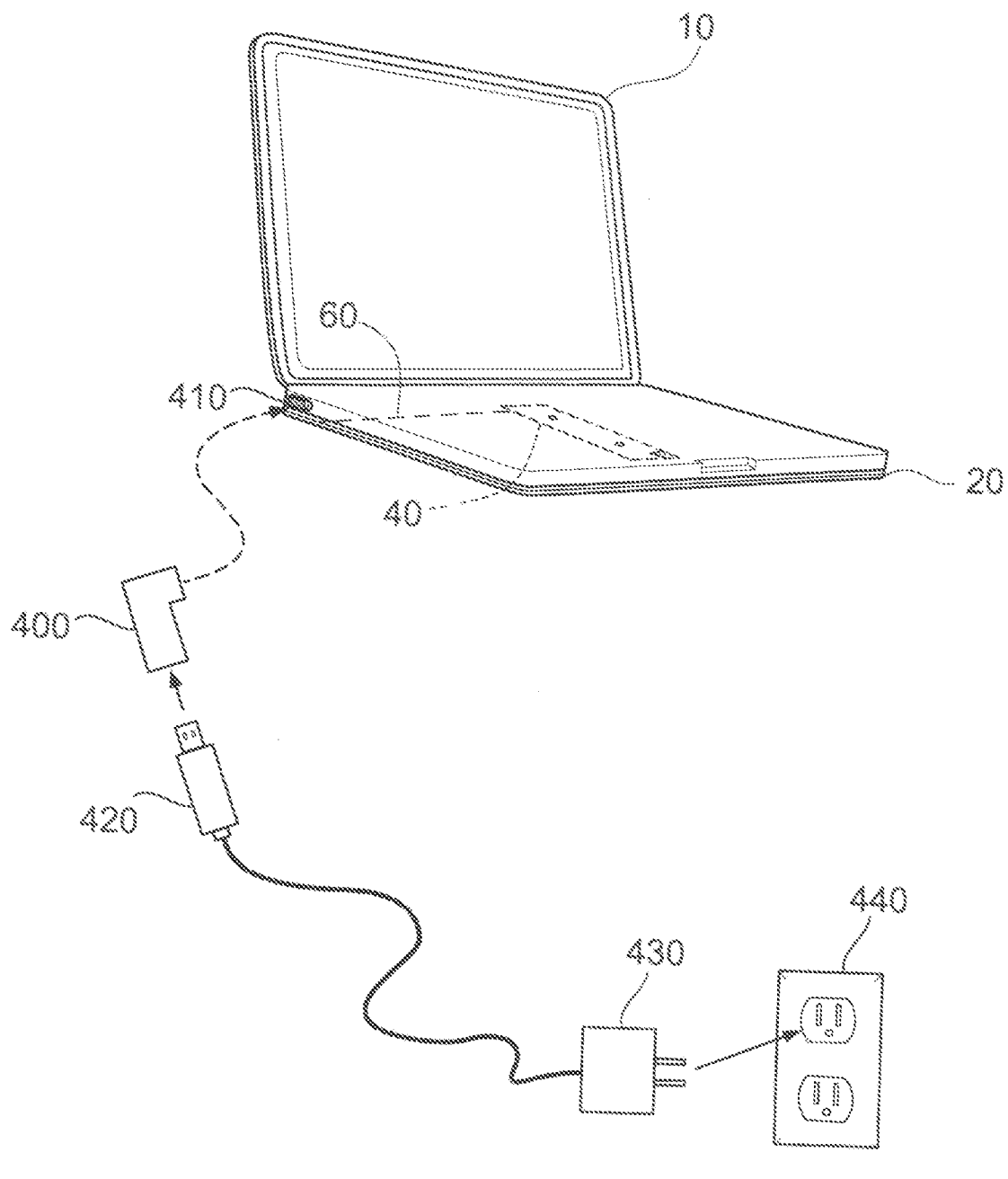
FIG. 10 is an illustration of a magnetic charger connector for use with mobile devices according to a preferred embodiment of the invention.

In a typical scenario according to a preferred embodiment of the invention, and referring to FIGS. 1 to 7, each charging slot 204 contains a base station 30. In the example of FIGS. 9 and 10, there are a total of 18 charging slots in the groups 340, 345, and 350. Each of these 18 charging slots may accept a mobile device for charging. When a mobile device 10 containing receiver 40 is placed into a charging slot, the mobile device slides into the correct position using gravity to fully insert the mobile device into the charging slot. Once in place, electrical prongs 51 and 52 contact two charging plates 95$a$ and 95$b$ contained in base station 30. Upon contact, the controller contained in base station 30 begins communication with receiver 40, which is in turn connected to the mobile device through a charging and communications port, such as USB-C. In this manner, base station 30 receives information from the mobile device to determine its state of electrical charge and other parameters indicating the status of the mobile device, such as version of operation system software and version of other application software. Each mobile device typically has a globally unique ID that uniquely identifies that device, along with a host of parameters associated with that mobile device.

Base station 30 then transmits those parameters to a respective power distribution controller 300, 305, or 310, depending upon the charging slot used. The respective power distribution controller 300, 305, or 310, then transmits those parameters to master controller 800, which then determines the proper method of charging the specific mobile device. In a preferred embodiment of the invention, master controller 800 implements battery charging optimization, which determines the optimal charging method for each connected mobile device depending upon factors such as the total wattage available to charge from the local receptacle providing power, the state of charge, battery type, and the number of other devices connected and charging.

The invention will, for example, when charging a number of laptops, monitor power draw to each laptop to ensure that no laptop or group of laptops draws too much charging power. In this manner, master controller 800 ensures that power supply 900 does not draw more than a prescribed amount of wattage from the electrical receptacles providing power to the system.

In addition, as illustrated in FIG. 9, intra-rack communications port 210 and intra-rack power connector 211, allow a daisy chain of other cabinets to be connected, so that multiple charging cabinets can be connected to a single wall receptacle. Master controller 800 has internal software to automatically recognize the connection of other cabinets in this manner and then control power output as needed so as not to overload the power receptacle.

Master controller 800 also ensures that no individual laptop is provided with more than optimal charging wattage. Lithium ion batteries, for example, are known to charge best at full power under 60% charge state, but then the charging signal must be pulsed above 60% charge to prevent overcharging and prolong battery life. Master controller 800 therefore monitors the charge state and outputs the optimal amount and type of power signal to fully charge each laptop individually connected at the maximum rate allowed, given the maximum amount of power available to power supply 900.

In a preferred embodiment of the invention, master controller 800 can simultaneously monitor and charge up to 30 mobile devices simultaneously from a single 15-*amp* receptacle without tripping the breaker. This number may be varied in other applications, given the availability of different power receptacles in any given situation and the settings of master controller 800. For example, schools with older power systems that have lower-rated receptacles and far fewer available receptacles in a classroom, may choose to charge all laptops in a single mobile device charging station. That is possible in an overnight scenario where master controller 800 is set to charge more laptops at a lower rate overnight. On the other hand, if a classroom has an available 30- or 50-amp receptacle, master controller 800 may be set to charge all laptops at the maximum safe rate.

The added advantage of the configuration shown in FIG. 9 provides additional tracking, monitoring and control of each mobile device in the charging station. The embodiment of FIG. 9 illustrates 18 individual charging slots controlled by master controller 800 through distribution controllers 340, 345, and 350. Each mobile device placed into a charging slot has its own state of charge. Each mobile device also has its own operability state indicating how well it is operating. Each mobile device also has its own update status indicating the version of its operating system, and key applications running on the mobile device. A preferred embodiment of the invention allows connection to each mobile device using master controller 800, whereby the individual parameters and overall state of each mobile device is observed and reported to an external user through one or more communications ports, such as ethernet port 235, WiFi port 225, and Bluetooth port 240. A preferred embodiment of the invention allows the user to manually or automatically update the operating system and applications on each mobile device, preferably overnight while charging.

This communication offers a tremendous additional advantage. The user is also able to track each mobile device in his or her inventory. School I/T administrators, for example, can easily determine the physical location of each mobile device, along with its operability, charge state, and update status from the parameters received. In this manner, an administrator can keep track of all devices and immediately determine when a device is inoperable or stolen. A preferred embodiment of the invention provides an application that may be used by an administrator for this purpose. Automatic alarms are provided via text or email, for example, that will instantly notify a teacher or administrator upon the conclusion of class whether each and every device is still located in the classroom or school building. This allows the teacher or administrator to act quickly to recover lost or stolen devices. It also allows them to locate and place devices that were inadvertently left in locations other than the mobile device charging station.

A magnetic charger 400 according to a preferred embodiment of the invention is illustrated in FIG. 10. As illustrated in FIG. 4, receiver 40 is preferable embedded within an enclosure 20 that fits over the exterior of a mobile device 10, such as a laptop. Power cable 60 extends from receiver 40 to the charging port 70 so that it is inserted directly into charging port 70 when enclosure 20 is installed onto mobile device 10. In a preferred embodiment, the exterior of enclosure 20 includes a ferrous metal connection port 410 designed to accept magnetic charger 400 to connect with the charging port 70 of mobile device 10. In most modern laptops, the current standard is a USB-C port that provides both charging and communications with the laptop. A standard charging or communication cable 420 may be connected to magnetic charger 400 and powered by adapter 430, which is in turn connected to a standard receptacle 440. When magnetic charger 400 is connected to connection port 410, power is provided to the mobile device.

Because this external connection would impact and conflict with charging through a base station 30, processor 55 is configured to automatically detect connection with magnetic charger 400. When charger 400 is detected, base station 30 disables charging and communication from all other sources.

The invention has been described with reference to the preferred embodiments without limit thereto. Additional embodiments and improvements may be realized which are not specifically set forth herein but which are within the scope of the invention as more specifically set forth in the claims appended hereto.

The invention claimed is:

1. A system for automatically charging a multiplicity of mobile devices, comprising:
   a power supply;
   a cabinet comprising a multiplicity of base units, each comprising one or more charging plates, wherein, when a receiver is placed in contact with one of said multiplicity of base units, power then flows from said one or more charging plates to a mobile device; and
   a processor operably connected to said power supply and said multiplicity of said base units, wherein the processor is configured to electrically communicate with said power supply and said multiplicity of said base units to control the flow of power to said mobile device.

2. The system of claim 1 further comprising a processor operably connected to said power supply and said multiplicity of said base units, wherein the processor is configured to electrically communicate with said power supply and said multiplicity of said base units.

3. The system of claim 2, wherein said processor is configured to control the flow of power to said mobile device.

4. The system of claim 1 further comprising a receiver attached to an enclosure for use with said mobile device, wherein said receiver comprises two electrical prongs that extend outwardly, and wherein said receiver attaches to the power input of said mobile device.

5. The system of claim 1, wherein said processor is configured to respond to receipt of a parameter indicating that said mobile device needs to be charged, by directing said power supply to deliver electrical power to said mobile device.

6. The system of claim 1, wherein said processor is configured to respond to receipt of a parameter indicating that said mobile device needs to be charged, by directing said power supply to deliver electrical power to said mobile device in an optimal pattern so as to safely charge the battery within said mobile device.

7. The system of claim 1, wherein said processor is further configured to respond to receipt of a parameter indicating that more than one side mobile device needs to be charged, by directing said power supply to deliver electrical power to each of the more than one said mobile devices.

8. The system of claim 1, wherein said processor is further configured to respond to receipt of a parameter indicating that more than one said mobile device needs to be charged, and that the charge state of each said mobile device requires delivery of power for charging at a different rate, by directing said power supply to deliver electrical power to each of the more than one said mobile device at a different rate that is optimal for individual charging for each said mobile device.

9. The system of claim 1, wherein said processor is further configured to respond to receipt of a parameter indicating that more than one said mobile device needs to be charged, by directing said power supply to limit its delivery of electrical power to each of the more than one said mobile device so as not to overload the receptacle providing power to said system.

10. The system of claim 1, wherein said processor is further configured to respond to receipt of a parameter indicating that said mobile device needs to be updated, by electronically delivering one or more updates to said mobile device.

11. The system of claim 1, wherein said processor is further configured to respond to receipt of a parameter indicating that said mobile device needs to be updated, by electronically delivering an electronic message to a user of said system.

12. The system of claim 1, wherein said processor is further configured to respond to receipt of a parameter indicating that said mobile device is properly placed within said cabinet, by electronically delivering an alert message to one or more users.

13. The system of claim 1, wherein said processor is further configured to respond to receipt of a parameter indicating that said mobile device is properly placed within said cabinet, by illuminating an indicator light.

14. The system of claim 1, wherein said processor is further configured to respond to receipt of a parameter indicating that said mobile device is not properly placed within said cabinet, by illuminating an indicator light.

15. The system of claim 1, wherein said processor is further configured to respond to receipt of a parameter indicating that said mobile device is not properly placed within said cabinet, by electronically delivering an alert message to one or more users.

16. The system of claim 1 further comprising one or more vents in said cabinet so as to facilitate the circulation of air within said cabinet.

17. The system of claim 1 further comprising one or more fans in said cabinet so as to facilitate the circulation of air within said cabinet.

18. The system of claim 1 wherein each of said multiplicity of base units are set at an angle so as to facilitate proper placement of one or more mobile devices within said cabinet.

19. A non-transitory computer readable medium encoded with a computer program comprising instructions that when executed by one or more processors cause the one or more processors to perform operations comprising:

receiving status information of one or more of a multiplicity of connected mobile devices situated within a charging cabinet, and in response to said receiving status information of one of said multiplicity of connected mobile devices, performing a function that is needed by said one of said multiplicity of connected mobile devices.

20. The non-transitory computer readable medium of claim 19 wherein each of said connected mobile devices comprises a receiver attached to an enclosure for use with each of said connected mobile device, wherein said receiver comprises two electrical prongs that extend outwardly, and wherein said receiver attaches to the power input of said one of said multiplicity of connected mobile devices.

21. The non-transitory computer readable medium of claim 19 wherein when said receiver is placed in contact with said base unit, said two electrical prongs establish electrical contact with at least two of said multiplicity of charging plates, and wherein power then flows from said base unit to said mobile device.

22. The non-transitory computer readable medium of claim 19 wherein said charging cabinet comprises a multiplicity of base units, each of said base units comprising a substantially flat surface comprising a multiplicity of charging plates.

23. The non-transitory computer readable medium of claim 19 further comprising instructions wherein said performing a function that is needed by said one of said multiplicity of connected mobile devices comprises charging the battery of said one of said multiplicity of connected mobile devices.

24. The non-transitory computer readable medium of claim 19 further comprising instructions wherein said performing a function that is needed by said one of said multiplicity of connected mobile devices comprises updating the software operating on said one of said multiplicity of connected mobile devices.

25. The non-transitory computer readable medium of claim 19 further comprising instructions wherein said performing a function that is needed by said one of said multiplicity of connected mobile devices comprises notifying a user of said function that is needed by said one of said multiplicity of connected mobile devices.

26. The non-transitory computer readable medium of claim 19 further comprising instructions wherein said performing a function that is needed by said one of said multiplicity of connected mobile devices comprises populating a database with said status information of one or more of a multiplicity of connected mobile devices.

27. A system for automatically charging mobile devices, comprising a charging cabinet comprising a base unit comprising one or more charging plates, wherein when a receiver is placed in contact with said base unit, said two electrical prongs establish electrical contact with said one or more charging plates, wherein said receiver is attached to an enclosure for use with a mobile device, wherein said receiver comprises two electrical prongs that extend outwardly, wherein said receiver attaches to the power input of said mobile device and wherein power then flows from said base unit to said mobile device.

28. The system of claim 27, wherein said base further comprises a processor.

29. The system of claim 27 wherein said receiver further comprises a processor.

30. The system of claim 27, wherein said charging cabinet further comprises a processor.

31. A non-transitory computer readable medium encoded with a computer program comprising instructions that when executed by one or more processors cause the one or more processors to perform operations comprising providing status information of one of a multiplicity of automatically charging mobile devices, each of said automatically charging mobile devices comprising:

a receiver attached to an enclosure for use with a mobile device, wherein said receiver comprises two electrical prongs that extend outwardly, and wherein said receiver attaches to the power input of said mobile device, a substantially flat base unit comprising a multiplicity of charging plates, wherein, when said receiver is placed in contact with said base unit, said two electrical prongs establish electrical contact with at least two of said multiplicity of charging plates, and wherein power then flows from said base unit to said mobile device.

32. The non-transitory computer readable medium of claim 31, wherein said base unit further comprises a processor.

33. The non-transitory computer readable medium of claim 31, wherein said receiver further comprises a processor.

34. The non-transitory computer readable medium of claim 31, wherein said cabinet further comprises a processor.

\* \* \* \* \*